United States Patent [19]

Shimokawato

[11] Patent Number: 4,814,053
[45] Date of Patent: Mar. 21, 1989

[54] SPUTTERING TARGET AND METHOD OF PREPARING SAME

[75] Inventor: Satoshi Shimokawato, Nagano, Japan

[73] Assignee: Seiko Epson Corporation, Tokyo, Japan

[21] Appl. No.: 33,719

[22] Filed: Apr. 3, 1987

[30] Foreign Application Priority Data

Apr. 4, 1986 [JP] Japan .................................. 61-77807
Jun. 23, 1986 [JP] Japan ................................ 61-146743

[51] Int. Cl.$^4$ .............................................. C23C 14/00
[52] U.S. Cl. ............................ 204/192.15; 204/192.2; 204/298; 420/83; 148/301; 148/303
[58] Field of Search ....................... 148/301, 302, 303; 428/579; 420/83, 16; 204/192.15, 192.2, 298, 298 TC

[56] References Cited

U.S. PATENT DOCUMENTS

| 4,081,297 | 3/1978 | Nagel et al. | 148/301 |
| 4,135,953 | 1/1979 | Nagel et al. | 148/301 |
| 4,221,613 | 9/1980 | Imaizumi et al. | 148/101 |
| 4,620,872 | 11/1986 | Hijikata et al. | 148/301 |
| 4,695,514 | 9/1987 | Takahashi et al. | 428/900 |
| 4,710,242 | 12/1987 | Yamagishi et al. | 148/301 |

OTHER PUBLICATIONS

"Method of Making Rare Earth Transition Metal Alloy Sputtering Targets", Xerox Disclosure Journal, vol. 10, No. 4, Jul./Aug. 1985, pp. 187–188.

Primary Examiner—John F. Niebling
Assistant Examiner—Steven P. Marquis
Attorney, Agent, or Firm—Blum Kaplan

[57] ABSTRACT

A sputtering target suitable for use in preparing a magneto-optic recording medium having the composition:

$$[(LR)_x(HR)_{1-x}]_y(Fe_wA_{1-w})\phi-y-zM_z$$

wherein HR is at least one heavy rare earth element selected from the group consisting of gadolinium (Gd), terbium (Tb) and dysprosium (Dy); LR is at least one light rare earth element selected from the group consisting of cerium (Ce), praseodymium (Pr), neodymium (Nd) and samarium (Sm); M is at least one element selected from the group consisting of titanium (Ti), aluminum (Al), chromium (Cr) and copper (Cu); A is at least one transition metal element selected from the group consisting of cobalt (Co) and nickel (Ni); x is between about 0.05 and 0.60; w is between about 0.5 and 1.0; y is between about 10 and 50; and z is between about 0 and 15 is provided. A method of casting the sputtering target so as to form a target having an oxygen impurity content of less than about 500 ppm is also provided.

12 Claims, 2 Drawing Sheets

SPUTTERING TARGET AND METHOD OF PREPARING SAME

BACKGROUND OF THE INVENTION

This invention relates to cast sputtering targets and, more particularly to an improved cast sputtering target for forming a magnetic alloy thin film to be used as a recording medium in a magneto-optic device.

Conventional magnetic alloy thin films containing heavy rare earth elements and transition metals are generally prepared by vacuum evaporation, sputtering and the like. The most common method is sputtering because it provides the best magnetic thin films. These films can be mass produced due to improvements in the magnetron sputtering process.

Formation of alloy thin films by sputtering is classified into the following three groups depending on the structure of the sputtering target:

1. The target can be a composite target;
2. A "multi-sputtering" target using a plurality of targets; or
3. An alloy target.

In the case of a composite target, the composition of the alloy thin film is controlled by varying the ratio of the areas of each of the elements on the target surface. Two types of composite targets are available. In the first, a metal chip is disposed on a target formed of a different metal and is known as a "chip-on-target". Such a chip-on-target is not suitable for forming magnetic thin films over an extended period of time because the surface area of the chips is reduced as the target wears. This reduction in surface area causes the composition of the resultant magnetic thin film to vary.

The second type of composite target is an "embedded-in-target" wherein one type of metal is embedded in a different base metal. An embedded-in-target is an improvement over a chip-on-target since magnetic thin films prepared using such a target have a uniform composition even when the target is sputtered for an extended period of time. This is due to the fact that the area of each material embedded in the base metal barely changes as a function of target wear. However, both the embedded-in-target and the chip-on-target have a shortcoming in that the deposition of each element on the target surface affects the final thin film composition in the film plane.

When a plurality of targets are used in accordance with a multi-sputtering method, each target is formed of a different metal. The targets are sputtered simultaneously to form an alloy film on a substrate. Radio frequency (RF) power, direct current (DC) power or some combination of RF and DC electric power is supplied to each of the targets to form the alloy film. An advantage of this method is that the alloy composition can be changed readily by controlling the power supplied to each target.

The multi-sputtering method also has some shortcomings. For example, a plurality of power sources must be provided in addition to the plurality of targets and it is necessary to take countermeasures to prevent radio frequency interference. Finally, it is difficult to prepare homogeneous alloy thin films over extended periods of time since the composition of the films is affected by the speed of deposition and the variation in film thickness distribution as the target wears. Deposition speed and film thickness distribution variation directly cause fine changes in composition and homogeneity of resulting alloy films.

Magnetic thin films resulting from sputtering of alloy targets have a homogeneous composition because such targets are macroscopically homogeneous in both the vertical and horizontal directions. Therefore, such alloy thin films have a homogeneous composition even when sputtering is repeated many times.

Alloy targets may also be classified as sintered or cast targets. Sintered targets having a large surface area can be formed irrespective of the type of material that is used. However, special techniques are necessary in order to reduce the content of impurities, such as oxygen and nitrogen to less than about 2000 ppm. Therefore, it is difficult to form high purity alloy thin films by sputtering sintered targets.

The oxygen content of a cast target can be lowered to less than about 500 ppm and high purity alloy thin films can be provided by sputtering cast targets. Cast targets are prepared by melting the desired metals in appropriate proportions and casting the melted material in an inert gas atmosphere or under vacuum. The impurity level is lower because there is no powder used in processing. In addition, impurities are removed as slag when the metals are melted.

The best method for industrially manufacturing alloy thin films is to sputter a cast target. However, alloy ingots or targets formed of heavy rare earth metals and transition metals tend to form intermetallic compounds and crack easily. It is difficult to form an alloy ingot in the shape of a target having a large surface area.

Accordingly, it is desirable to provide an improved sputtering target for use in preparing homogeneous alloy thin films that can be used in improved magneto-optic recording media.

SUMMARY OF THE INVENTION

Generally speaking, in accordance with the invention, an improved sputtering target having the following composition is provided:

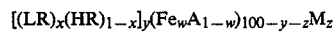

$$[(LR)_x(HR)_{1-x}]_y(Fe_wA_{1-w})_{100-y-z}M_z$$

wherein HR is at least one heavy rare earth element selected from the group consisting of gadolinium (Gd), terbium (Tb) and dysprosium (Dy); LR is at least one light rare earth element selected from the group consisting of cerium (Ce), praseodymium (Pr), neodymium (Nd) and samarium (Sm); M is at least one element selected from the group consisting of titanium (Ti), aluminum (Al), chromium (Cr) and copper (Cu); A is at least one transition metal element selected from the group consisting of cobalt (Co) and nickel (Ni); x is between about 0.05 and 0.60; w is between about 0.5 and 1.0; y is between about 10 and 50; and z is between about 0 and 15.

The sputtering target of the invention is prepared by a casting method and has an oxygen impurity content of less than about 500 ppm. These alloy sputtering targets are useful for forming magneto-optic thin films containing heavy rare earth elements and transition metals as major constituents as well as light rare earth elements and at least one element selected from titanium, aluminum, chromium and copper.

Accordingly, it is an object of the invention to provide an improved sputtering target containing heavy rare earth elements, light rare earth elements, transition metal elements and at least one element selected from titanium, aluminum, chromium and copper.

Another object of the invention is to provide an improved sputtering target having a high degree of purity.

A further object of the invention is to provide a sputtering target having a large surface area.

Still another object of the invention is to provide a sputtering target that can be prepared by a casting process.

Yet a further object of the invention is to provide a method for preparing an alloy sputtering target having an oxygen impurity content of less than about 500 ppm.

Still other objects and advantages of the invention will in part be obvious and will in part be apparent from the specification.

The invention accordingly comprises a composition of matter possessing the characteristics, properties, and the relation of constituents and the several steps and the relation of one or more of such steps with respect to each of the others which will be exemplified in the composition hereinafter described, and the scope of the invention will be indicated in the claims.

DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Sputtering targets prepared in accordance with the invention include at least one heavy rare earth element, at least one light rare earth element, at least one transition metal element and at least one element selected from titanium, aluminum, chromium and copper. As used herein, the term "heavy rare earth element" refers to lanthanide series elements having an atomic number of 64 or greater; and "light rare earth elements" refers to lanthanide series elements having an atomic number of 62 or less.

The sputtering targets are prepared by melting the metal material having a purity greater than about 99.9% in an induction furnace under vacuum. The melted material is cast under argon atmosphere and the cast material is machined to form a disk having a diameter of 15 cm and a thickness of 5 mm. The disk is adhered to a copper backing plate using indium series solder.

The compositions of the sputtering targets prepared in accordance with the invention are described in more detail with reference to the following examples. These examples are presented for purposes of illustration only and are not intended to be construed in a limiting sense.

EXAMPLE 1

Alloy sputtering targets having the composition $(Nd_xDy_{1-x})_y(Fe_{0.60}Co_{0.40})_{100-y-z}Ti_z$ were prepared by casting. The values of x, y and z were varied as shown in Table 1.

TABLE 1

| | x | y | z |
|---|---|---|---|
| Sample No. | | | |
| 1 | 0.05 | 10 | 15 |
| 2 | 0.05 | 20 | 10 |
| 3 | 0.25 | 25 | 4 |
| 4 | 0.30 | 20 | 10 |
| 5 | 0.40 | 15 | 4 |
| 6 | 0.45 | 30 | 2 |
| 7 | 0.60 | 50 | 1 |
| Comparative Example No. | | | |
| 1 | 0 | 23 | 0 |
| 2 | 0 | 23 | 5 |
| 3 | 0.20 | 25 | 0 |

Sample Nos. 1 through 7 exhibited good properties as sputtering targets. However, the compositions of Comparative Examples 1 and 2 cracks when they were cast and the target of Comparative Example 3 cracked when it was machined. As can be seen, it was necessary to include each of a light rare earth element, a heavy rare earth element, a transition metal element and titanium in order to provide a useful sputtering target. Similar results were obtained when titanium was replaced by aluminum, chromium or copper.

EXAMPLE 2

Sputtering targets having the composition:

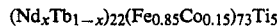

$(Nd_xTb_{1-x})_{22}(Fe_{0.85}Co_{0.15})_{73}Ti_5$ wherein x was 0.05, 0.20, 0.40, 0.60 and 0.80, respectively, were prepared by casting. All of the cast targets had suitable properties for use as sputtering targets. The targets were set up in a vacuum chamber and the chamber was evacuated to an initial vacuum pressure of less than about $1.6\times10^{-6}$ Torr. Argon gas at a pressure of $2\times10^{-3}$ Torr was introduced into the chamber for use as a carrier gas. RF power of 350 W was supplied to the targets to create a cathode. The targets were sputtered and a magnetic thin film having a thickness of 50 nm was formed on a glass substrate. An aluminum protective layer having a thickness of 100 nm was formed on the magnetic thin film.

Figure 1:
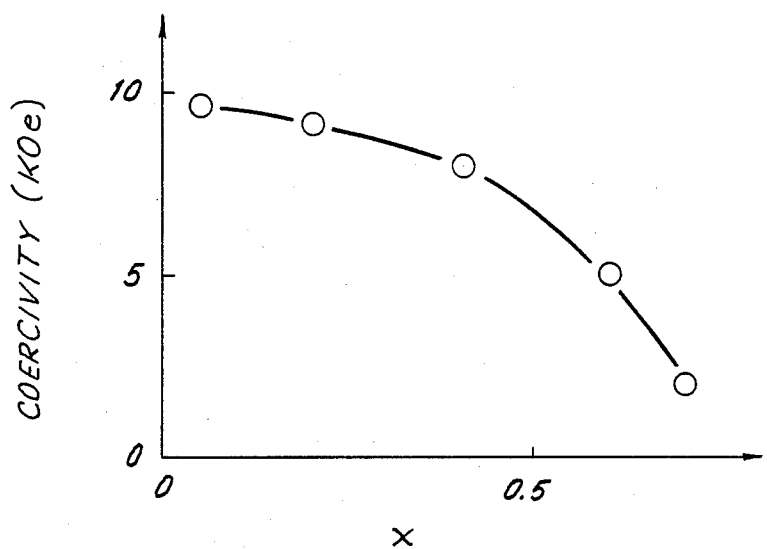
FIG. 1 is a graph showing the relationship between coercivity and x for an alloy thin film prepared using a sputtering target having the formula $(Nd_xTb_{1-x})_{22}(Fe_{0.85}Co_{0.15})_{73}Ti_5$.

The coercivity for the Kerr hysterisis loop was measured as a function of x and the results are shown in FIG. 1. When x is greater than about 0.6, the coercivity was reduced significantly and desirable magnetic properties were not obtained. Similar results were obtained when the titanium was replaced by aluminum, chromium or copper.

EXAMPLE 3

Sputtering targets having the composition:

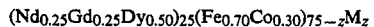

$(Nd_{0.25}Gd_{0.25}Dy_{0.50})_{25}(Fe_{0.70}Co_{0.30})_{75-z}M_z$ wherein M was titanium, aluminum, chromium or copper and z was 1, 5, 10, 15 and 20, respectively, were prepared by casting. Magnetic thin films were formed on glass substrates using these targets in the manner described in Example 2.

Figure 2:
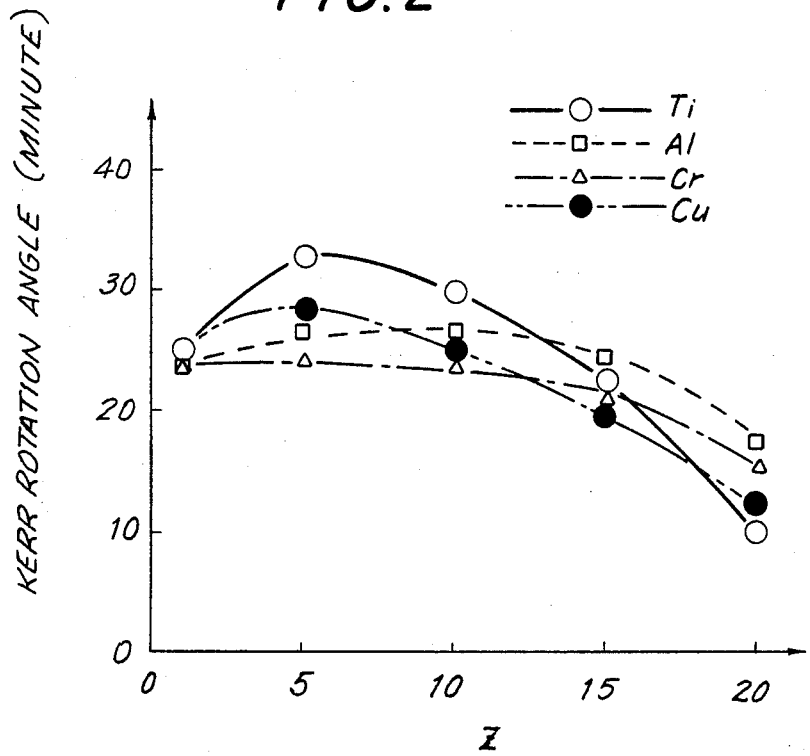
FIG. 2 is a graph showing the relationship between Kerr rotation angle and z for an alloy thin film having the composition $(Nd_{0.25}Gd_{0.25}Dy_{0.50})_{25}(Fe_{0.70}Co_{0.30})_{75-z}M_z$, wherein M is selected from titanium, aluminum, chromium and copper.
Figure 3:
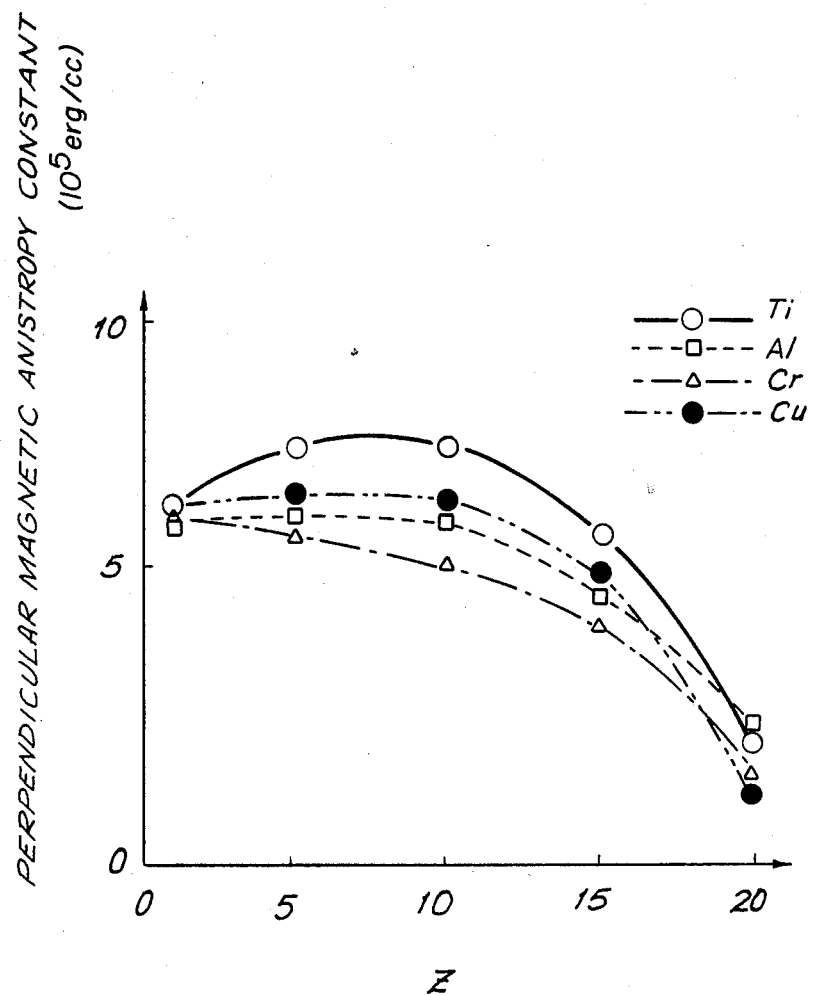
FIG. 3 is a graph showing the relationship between the magnetic anistropy constant and z for a thin film having the composition $(Nd_{0.25}Gd_{0.25}Dy_{0.50})_{25}(Fe_{0.70}Co_{0.30})_{75-z}M_z$, wherein M is selected from titanium, aluminum, chromium and copper.

FIG. 2 shows the relationship between Kerr rotation angle and z, wherein z is the total amount of titanium, aluminum, chromium or copper in the composition. FIG. 3 shows the relationship between the magnetic anistropy constant and z. Both Kerr rotation angle and the magnetic anistropy constant were reduced significantly when z was greater than about 15 and these magnetic films were not suitable for use as magneto-optic thin films. However, the variation in Kerr rotation angle and magnetic anistropy constant was within permitted tolerances when z was less than about 15. The use of titanium or copper improved the magnetic properties.

EXAMPLE 4

Sputtering targets prepared by a casting method in accordance with the invention were evaluated in comparison with conventional targets prepared by a sintering method. Each of the targets had the composition $(Nd_{0.22}Dy_{0.78})_{25}(Fe_{0.60}Co_{0.40})_{71}Ti_4$. Magnetic thin films were formed as described in Example 2 using these targets. The magnetic thin films had a thickness of 40 nm and silicon nitride protective layers ($Si_3N_4$) having a thickness of 100 nm were formed on each film. Table 2 shows the effect of the method of preparation of the sputtering target on Faraday rotation angle, coercivity (Hc), anistropy constant (Ku) and oxygen (C(O)) measured by a "melting method" of each target.

TABLE 2

|  | Example | Comparative Example |
| --- | --- | --- |
| $\theta_F$ (min/nm) | 1.35 | 1.20 |
| Hc (KOe) | 8.5 | 4.2 |
| Ku (erg/cc) | $7.8 \times 10^5$ | $5.2 \times 10^5$ |
| C(O) (wt ppm) | 420 | 2450 |

As can be seen, the cast sputtering target was superior to a comparable target prepared by a sintering method in both magnetic and magneto-optic properties. This is believed to be due to the difference in oxygen content of the targets.

EXAMPLE 5

Magneto-optic recording medium was manufactured using a sputtering target prepared in accordance with the invention. The composition of the target was $(Nd_{0.22}Tb_{0.78})_{24}(Fe_{0.85}Co_{0.15})_{72}Ti_4$.

The recording medium had a multilayer structure and included a polycarbonate substrate having a diameter of 130 mm and a thickness of 1.2 mm formed with guide grooves having a groove width of 0.8 μm and a groove pitch of 1.6 μm on one side. An aluminum nitride layer having a thickness of 90 nm was formed on the grooved side of the polycarbonate substrate. A magnetic thin film having a thickness of 110 nm was formed on the aluminum nitride layer using the sputtering target of the invention. A second aluminum nitride layer having a thickness of 90 nm was formed on the magnetic thin film.

The recording medium was evaluated using a magneto-optic read/write device with a differential optical system. The rotation number of the disk was 900 rpm, the frequency was 1 MHz when information was written on the disk and the carrier to noise ratio was 55 dB in the resolution band width of 30 KHz when information was read from the disk.

A comparative recording medium was evaluated except that the TbFeCo magnetic thin film was formed using a sintered alloy sputtering target having the composition $Tb_{22}(Fe_{0.88}Co_{0.12})_{78}$. The carrier to noise ratio was 53 dB, which is inferior to the 55 dB measured for the magneto-optic recording medium prepared using the sputtering target of the invention. It is presumed that this difference in result is due to the relative oxygen contents of the targets. The sputtering target prepared in accordance with the invention had an oxygen content of 390 ppm and the sputtering target prepared by a sintering method for purposes of comparison was 2300 ppm.

As can be seen from these examples, cast sputtering targets prepared in accordance with the invention provide an alloy thin film containing heavy rare earth elements as well as transition metals. Since these sputtering targets content less oxygen than prior art sputtering targets, the magnetic properties are improved. In addition, the cost of the sputtering target is reduced because expensive heavy rare earth elements are replaced by less expensive and more abundant light rare earth elements. Neodymium can be replaced in whole or in part by cerium, praseodymium or samarium to obtain similar results. In addition, the combination of at least one of gadolinium, terbium and dysprosium with at least one of titanium, aluminum, chromium and copper exhibits good effects.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A sputtering target for use in preparing a magnetic thin film for a magneto-optic recording medium, comprising a combination of elements having the composition:

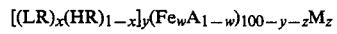

wherein HR is at least one heavy rare earth element selected from the group consisting of gadolinium (Gd), terbium (Tb) and dysprosium (Dy); LR is at least one light rare earth element selected from the group consisting of cerium (Ce), praseodymium (Pr), neodymium (Nd) and samarium (Sm); M is at least one element selected from the group consisting of titanium (Ti), aluminum (Al), chromium (Cr) and copper (Cu); A is at least one transition metal element selected from the group consisting of cobalt (Co) and nickel (Ni); x is between about 0.05 and 0.60; w is between about 0.5 and 1.0; y is between about 10 and 50; and z is between about 0 and 15.

2. The sputtering target of claim 1, wherein the sputtering target is prepared by a casting method and has an oxygen impurity content of less than about 500 ppm.

3. The sputtering target of claim 1, wherein the light rare earth element is selected from the group consisting of praseodymium, neodymium and samarium and combinations thereof.

4. A method of preparing a sputtering target, comprising:

melting a combination of elements represented by the formula:

$$[(LR)_x(HR)_{1-x}]_y(Fe_wA_{1-w})_{100-y-z}M_z$$

wherein HR is at least one heavy rare earth element selected from the group consisting of gadolinium (Gd), terbium (Tb) and dysprosium (Dy); LR is at least one light rare earth element selected from the group consisting of cerium (Ce), praseodymium (Pr), neodymium (Nd) and samarium (Sm); M is at least one element selected from the group consisting of titanium (Ti), alumimum (Al), chromium (Cr) and copper (Cu); A is at least one transition metal element selected from the group consisting of cobalt (Co) and nickel (Ni); x is between about 0.05 and 0.60; w is between about 0.5 and 1.0; y is between about 10 and 50; and z is between about 0 and 15; and casting the melted elements in an inert atmosphere to form a sputtering target.

5. The method of claim 4, wherein the elements being melted have a purity greater than about 99.9%.

6. The method of claim 4, wherein the elements are melted under vacuum.

7. The method of claim 4, including machining the sputtering target to form a disk.

8. The method of claim 7, including adhering the disk to a copper backing plate.

9. The method of claim 8, wherein the disk is adhered to the copper backing plate using indium series solder.

10. The method of claim 4, wherein the sputtering target has an oxygen impurity content of less than about 500 ppm.

11. The method of claim 4, wherein the light rare earth element is selected from the group consisting of praseodymium, neodymium and samarium and combinations thereof.

12. A method of preparing a magneto-optic recording medium comprising:

providing a substrate having an insulating layer on one surface thereof;

melting a combination of elements represented by the formula:

$$[(LR)_x(HR)_{1-x}]_y(Fe_wA_{1-w})_{100-y-z}M_z$$

wherein HR is at least one heavy rare earth element selected from the group consisting of gadolinium (Gd), terbium (Tb) and dysprosium (Dy); LR is at least one light rare earth element selected from the group consisting of cerium (Ce), praseodymium (Pr), neodymium (Nd) and samarium (Sm); M is at least one element selected from the group consisting of titanium (Ti), aluminum (Al), chromium (Cr) and copper (Cu); A is at least one transition metal element selected from the group consisting of cobalt (Co) and nickel (Ni); x is between about 0.05 and 0.60; w is between about 0.5 and 1.0; y is between about 10 and 50; and z is between about 0 and 15;

casting the melted elements in an inert atmosphere to form a sputtering target; and sputtering the sputtering target to deposit a magnetic thin film on the insulating layer.

* * * * *